(12) United States Patent
Peng et al.

(10) Patent No.: US 7,095,339 B2
(45) Date of Patent: Aug. 22, 2006

(54) APPARATUS FOR DATA INPUT AND KEY DETECTION METHOD THEREOF

(75) Inventors: Yu-Chun Peng, Taipei (TW); Wen-Whah Tsai, Taipei (TW); Kuo-Bing Fang, Taipei (TW); Tzu-Hsun Tung, Taipei (TW)

(73) Assignee: High Tech Computer Corp., (TW)

( * ) Notice: Subject to any disclaimer, the term of this patent is extended or adjusted under 35 U.S.C. 154(b) by 478 days.

(21) Appl. No.: 10/600,845

(22) Filed: Jun. 23, 2003

(65) Prior Publication Data

US 2004/0083312 A1    Apr. 29, 2004

(30) Foreign Application Priority Data

Oct. 25, 2002    (TW) ............................... 91125206 A (51) Int. Cl.
*H03M 11/00*    (2006.01)
(52) U.S. Cl. ............................ 341/26; 341/22; 345/168
(58) Field of Classification Search ................. 341/26, 341/22; 345/168
See application file for complete search history.

(56) References Cited

U.S. PATENT DOCUMENTS 4,667,181 A * 5/1987 Hastreiter .................... 341/26

FOREIGN PATENT DOCUMENTS

| TW | 469408 | 12/2001 |
|---|---|---|
| TW | 475144 | 2/2002 |

* cited by examiner

*Primary Examiner*—Wendy R. Garber
*Assistant Examiner*—Hung Q. Dang
(74) *Attorney, Agent, or Firm*—Birch, Stewart, Kolasch & Birch, LLP (57) ABSTRACT

An apparatus for data input. The apparatus comprises a sensing circuit for a plurality of keys, outputting an interruption signal and a corresponding group of data bits when one of the keys is pressed, a shift register circuit receiving a strobe signal, a clock signal and the group of data bits in parallel from the sensing circuit when the strobe signal is asserted, and serially outputting the group of data bits in synchronization with the clock signal, and a microcontroller receiving the interruption signal, outputting the strobe signal and clock signal when the interruption signal is asserted, and serially receiving the group of data bits from the shift register circuit to identify the key being pressed.

12 Claims, 7 Drawing Sheets

APPARATUS FOR DATA INPUT AND KEY DETECTION METHOD THEREOF

This nonprovisional application claims priority under 35 U.S.C. § 119(a) on patent application Ser. No(s). 091125206 filed in TAIWAN, R.O.C. on Oct. 25, 2002, which is(are) herein incorporated by reference.

BACKGROUND OF THE INVENION

1. Field of the Invention

The present invention relates to an apparatus for data input and particularly to a keypad or keyboard circuit, and key detection method thereof which achieves low power and system resource consumption.

2. Description of the Prior Art

Generally, there are two configurations of connection of the keypad or keyboard to the host.

One is to connect each of the keys to one of the GPIO (General Purpose Input and Output) pins of a controller in the host. The controller of the host is the only device to detect and identify the keys. This configuration is characterized by its simplicity. However, the controller must have enough GPIO pins to afford such connections and the required number of GPIO pins is equal to the number of keys. Since the GPIO pin number is limited and it is impossible to dedicate all of GPIO pins to the connections of the keypad or keyboard, this configuration only applies to a keypad or keyboard with a small number of keys. Moreover, the controller may not have a pin for interruption, which results in a need for periodical monitoring of the keys and may exhaust the controller resource.

As for the other configuration, it occupies fewer GPIO pins by disposing the key switches on intersections of lines arranged in a matrix and connecting the row and column lines, rather than each of the keys, to the controller. However, the controller must still monitor the keys by scanning the matrix. The monitoring of keys in a matrix is more complicated than that of keys being directly connected. This also exhausts the resource and raises the power consumption of the controller. Moreover, for a keypad or keyboard with a small number of keys, the required number of GPIO pins is not significantly reduced. Thus, this configuration generally applies to a keypad or keyboard with a large number of keys.

Neither of the two previously described configurations can perfectly apply to a PDA (Personal Digital Assistant). The number of keys in the PDA individually depends on its functional features and size requirement. Connecting each of the keys individually to the controller occupies too many GPIO pins and frustrates system designers. Connecting a key matrix to the controller does not significantly lower the burden on the controller and can even raise power consumption. High power consumption is critically disadvantageous to a battery powered PDA.

SUMMARY OF THE INVENTION

The object of the present invention is to provide an apparatus for data input and a key detection method thereof which reduces the required number of GPIO pins, resource and power consumption, and complexity of the operation of the controller.

The present invention provides an apparatus for data input comprising a sensing circuit for a plurality of keys, outputting an interruption signal and a corresponding group of data bits when one of the keys is pressed, a shift register circuit receiving a strobe signal, a clock signal and the group of data bits in parallel from the sensing circuit when the strobe signal is asserted, and serially outputting the group of data bits in synchronization with the clock signal, and a microcontroller receiving the interruption signal, outputting the strobe signal and clock signal when the interruption signal is asserted, and serially receiving the group of data bits from the shift register circuit to identify the key being pressed.

The present invention further provides an apparatus for data input comprising a sensing circuit for a plurality of keys, outputting an interruption signal and a corresponding group of data bits when one of the keys is pressed, a control circuit coupled to the sensing circuit outputting a strobe signal and clock signal when the interruption signal is asserted, a shift register circuit coupled to the sensing circuit and control circuit, receiving the strobe signal, the clock signal and the group of data bits in parallel from the sensing circuit when the strobe signal is asserted, and serially outputting the group of data bits in synchronization with the clock signal, and an identifying circuit coupled to the shift register circuit and serially receiving the group of data bits from the shift register circuit to identify the key being pressed.

The present invention also provides a method for key detection in an apparatus for data input comprising a sensing circuit for a plurality of keys, a shift register, and a microcontroller. The method comprises the steps of outputting by the sensing circuit a group of data bits corresponding to one of the keys being pressed, receiving and the group of data bits from the sensing circuit in parallel and serially outputting the received group of data bits by the shift register circuit, and serially receiving the group of data bits from the shift register circuit to identify the key being pressed.

The present invention provides an apparatus for data input comprising a switch circuit having a plurality of keys and forming an equivalent RC circuit corresponding to one of the keys being pressed, an oscillator generating a sinusoidal wave signal with a frequency corresponding to the equivalent RC circuit formed by the switch circuit when the key is pressed, a square wave generator receiving the sinusoidal wave signal from the oscillator to generating a corresponding square wave signal, and a processor identifying the key being pressed according to the square wave.

The present invention provides a method for key detection in an apparatus for data input comprising a switch circuit having a plurality of keys. The method comprises the steps of forming an equivalent RC circuit corresponding to one of the keys being pressed, generating a sinusoidal wave signal with a frequency corresponding to the equivalent RC circuit, generating a square wave signal corresponding to the sinusoidal wave signal, and identifying the key being pressed according to the square wave signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
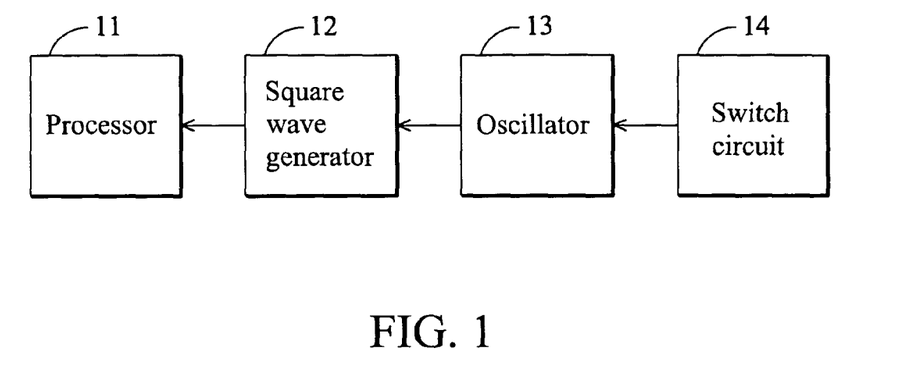
FIG. 1 is a diagram showing an apparatus for data input according to a first embodiment of the invention.

FIG. 1 is a diagram showing an apparatus for data input according to a first embodiment of the invention. It includes a processor 11, square wave generator 12, oscillator 13 and switch circuit 14. The switch circuit 14 has keys (not shown) and forms an equivalent RC circuit with an RC constant selected by the key being pressed. The oscillator 13 generates a sinusoidal wave signal with a frequency corresponding to the RC constant of the equivalent RC circuit formed by the switch circuit 14. The square wave generator 12 transforms the sinusoidal wave signal to a square wave signal with the same frequency. The processor 11 receives the square wave signal to identify the pressed key by the frequency thereof.

Figure 2:
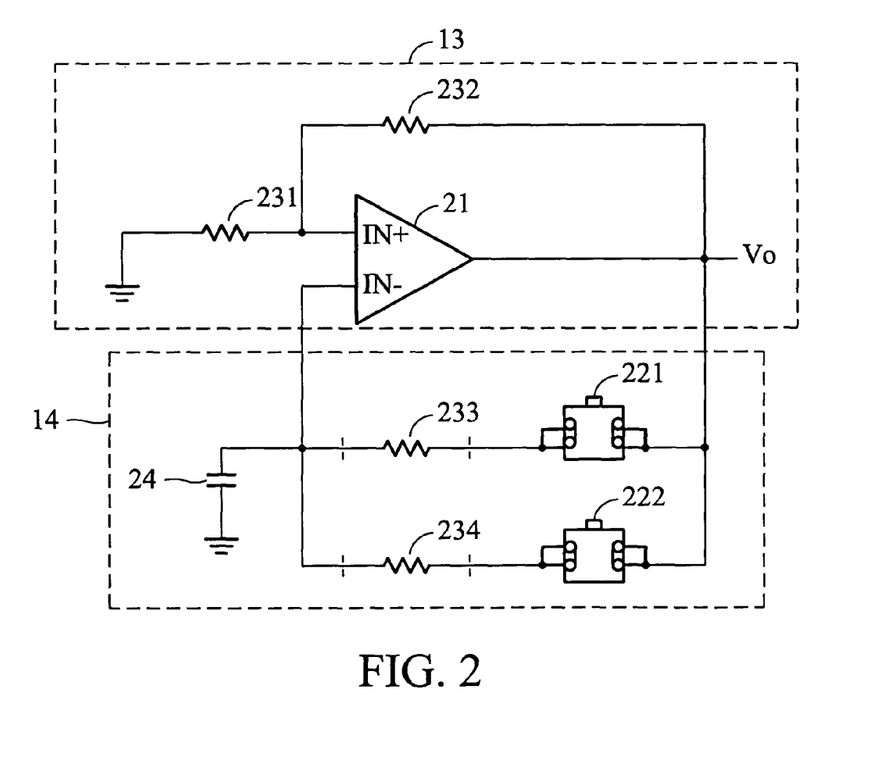
FIG. 2 is a diagram showing an oscillator and switch circuit of the apparatus for data input according to the first embodiment of the invention.

FIG. 2 is a diagram showing the oscillator 13 and switch circuit 14 of the apparatus for data input according to the first embodiment of the invention. The keys are implemented by switches 221 and 222 (only two switches are illustrated for example). The switch circuit 14 further includes a capacitor 24, and resistors 233 and 234. The switches 221 and 222 are coupled between the resistors 233 and 234, and the oscillator 13. The resistors 233 and 234 are coupled between the oscillator 13, and the switches 221 and 222 respectively. The capacitor 24 is coupled between the oscillator 13 and the ground.

The oscillator 13 includes an operational amplifier 21, and resistors 231 and 232. The operational amplifier 21 has a negative input terminal IN− and output terminal Vo respectively coupled to the capacitor 24 of the switch circuit 14, and the switches 221 and 222. The resistor 231 is coupled between the ground and a positive input terminal IN+ of the operational amplifier 21. The resistor 232 is coupled between the output terminal Vo and positive input terminal IN+ of the operational amplifier 21.

It is noted that, in FIG. 2, the switch circuit 14 forms an RC circuit composed of the capacitor 24 and one of the resistors 233 and 234 (depends on the key being pressed) when one of the switches 221 and 222 is closed. Thus formed, the RC circuit provides a feedback loop between the negative input terminal IN− and the output terminal Vo of the operational amplifier 21. Consequently, the oscillator 13 generates a sinusoidal wave signal with a frequency corresponding to the key being pressed.

Figure 3:
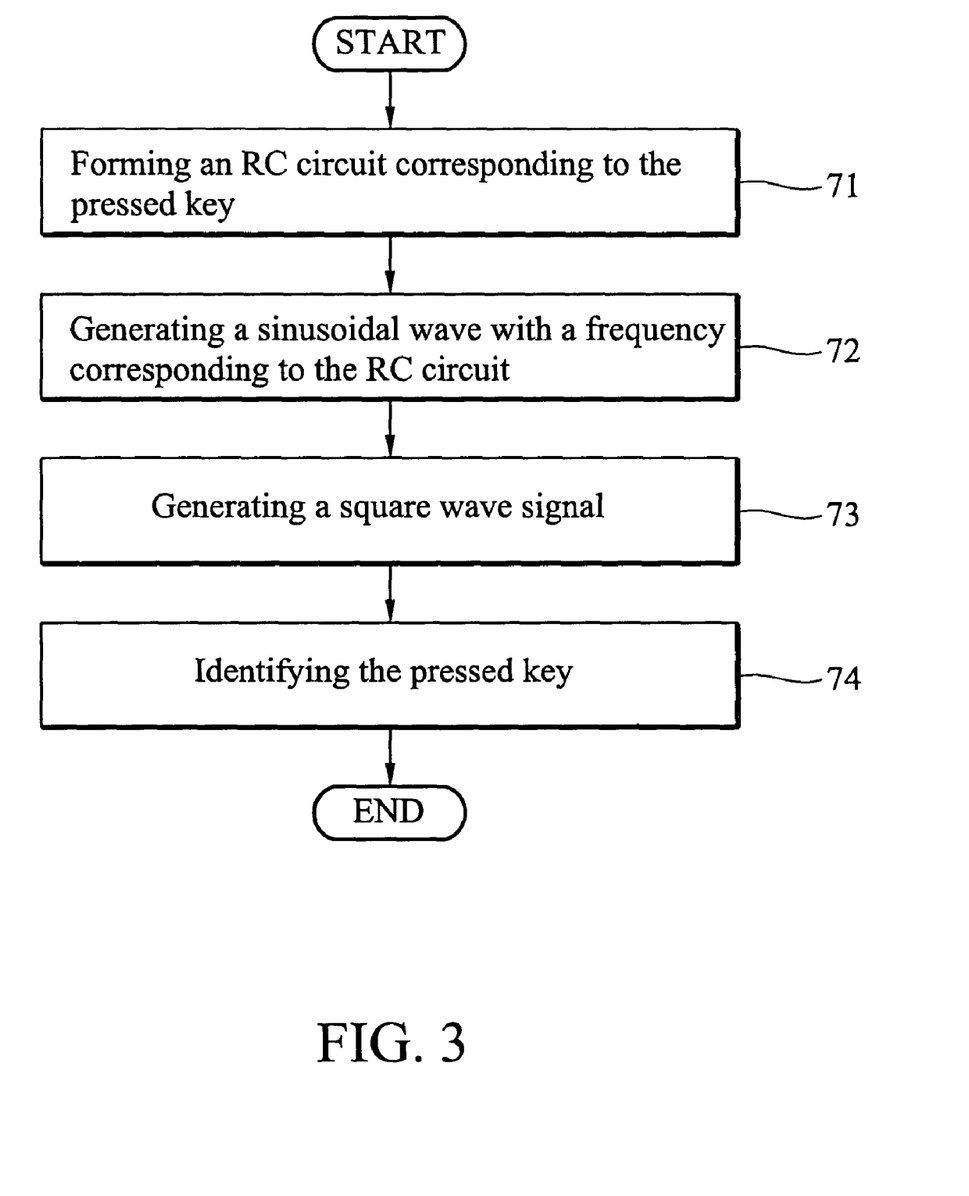
FIG. 3 is a flowchart of a method for key detection used in the apparatus for data input according to the first embodiment of the invention.

FIG. 3 is a flowchart of a method for key detection used in the apparatus for data input according to the first embodiment of the invention.

In step 71, an equivalent RC circuit with an RC constant corresponding to one of the keys 221 and 222 being pressed is formed by the switch circuit 14.

In step 72, a sinusoidal wave signal with a frequency corresponding to the RC constant of the equivalent RC circuit is generated by the oscillator 13.

In step 73, a square wave signal corresponding to the sinusoidal wave signal from the output terminal Vo of the oscillator 13 is generated by the square wave generator 12.

In step 74, the processor identifies the key being pressed according to the square wave signal.

Figure 4:
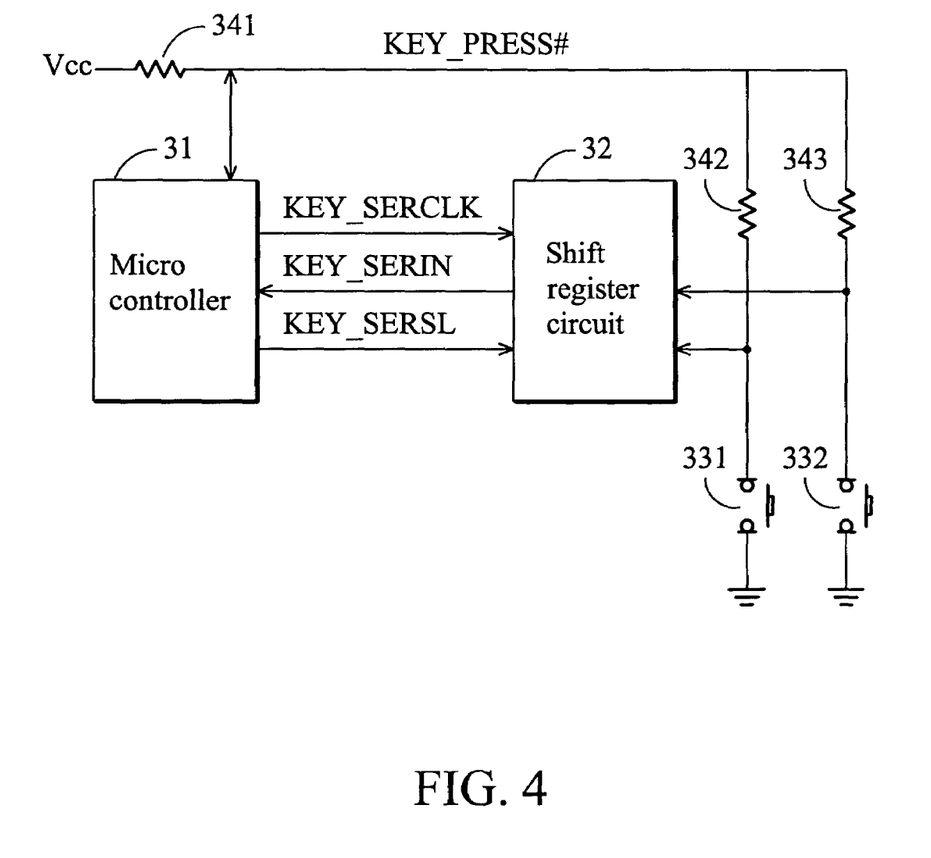
FIG. 4 is a diagram showing an apparatus for data input according to a second embodiment of the invention.

FIG. 4 is a diagram showing an apparatus for data input according to a second embodiment of the invention. It includes a sensing circuit composed of keys 331 and 332 (only two keys are illustrated for examples), and resistors 341, 342 and 343, a shift register circuit 32 and a microcontroller 31. The keys 331 and 332 are implemented by switches. The resistors 342 and 343 have first ends respectively coupled to the first ends of the switches 331 and 332 while the resistor 341 has a first end coupled to receive a power supply voltage Vcc and a second end coupled to both of the second ends of the resistors 342 and 343. The second ends of the switches 331 and 332 are commonly coupled to the ground.

Figure 5A:
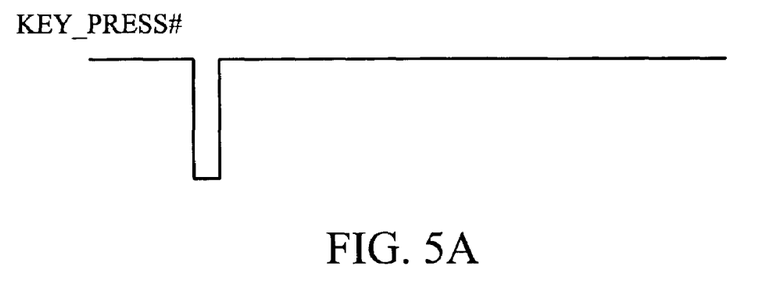
FIGS. 5A~5C are diagrams showing the timing of the signals in the apparatus for data input according to the second embodiment of the invention.
Figure 5B:
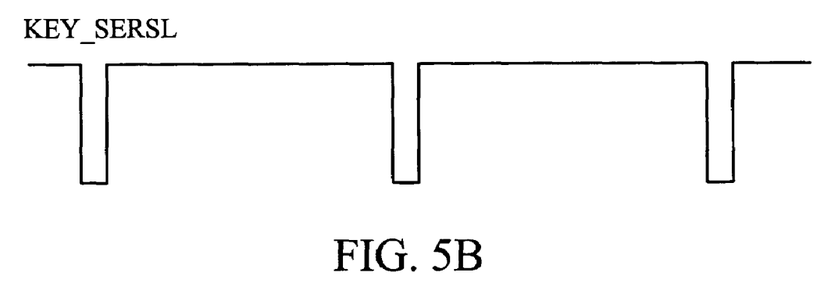
Figure 5C:
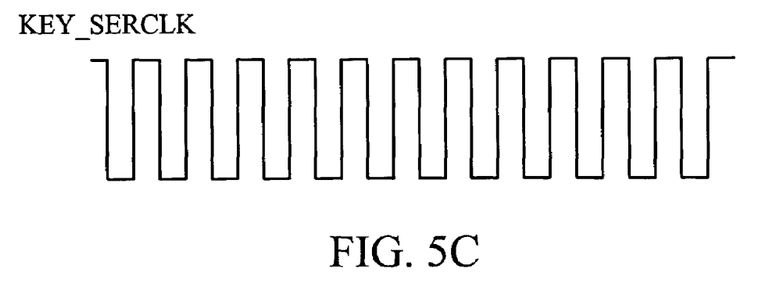

The sensing circuit outputs an interruption signal KEY_PRESS# which is asserted by being pulled down to a low logic voltage level (as shown in FIG. 5A) when any one of the keys 331 and 332 is pressed. The sensing circuit also outputs a group of data bits identifying the pressed key. For example, a group of data bits (0, 1) will be output to the shift register 32 if the key 332 is pressed, wherein the first data bit "0" represents the key 331 not being pressed while the second data bit "1" represents the key 332 being pressed. The microcontroller 31 receives the interruption signal KEY_PRESS#, and outputs a strobe signal KEY_SERSL and a clock signal KEY_SERCLK (as shown in FIG. 5C) to the shift register circuit 32. The strobe signal KEY_SERSL is asserted by being pulled down to the low logic voltage level (as shown in FIG. 5B) when the interruption signal is asserted. The shift register circuit 32 acts as a parallel-to-serial converter, which receives the group of data bits from the sensing circuit in parallel when the strobe signal is asserted and serially outputs the received data bits to the microcontroller 31 on the falling and rising edges of the clock signal KEY_SERCLK (i.e., in synchronization with the clock signal KEY_SERCLK). Thus, the microcontroller 31 identifies the pressed key according to the received data bits.

At the end of the assertion period of the interruption signal KEY_PRESS# is initiated by a pressed key, the microcontroller 31 forcibly pushes the interruption signal back to a high logic voltage level (as shown in FIG. 5A) so that the data bits for the pressed key can be generated. The microcontroller 31 then periodically asserts the strobe signal KEY_SERSL by pulling it down to the low logic voltage level (as shown in FIG. 5B) to determine whether the same data bits are still output from the sensing circuit due to the pressed key not yet being released. When the release of the key is detected, the microcontroller 31 stops pushing the interruption signal KEY_PRESS# until the end of a newly initiated assertion period.

Figure 6A:
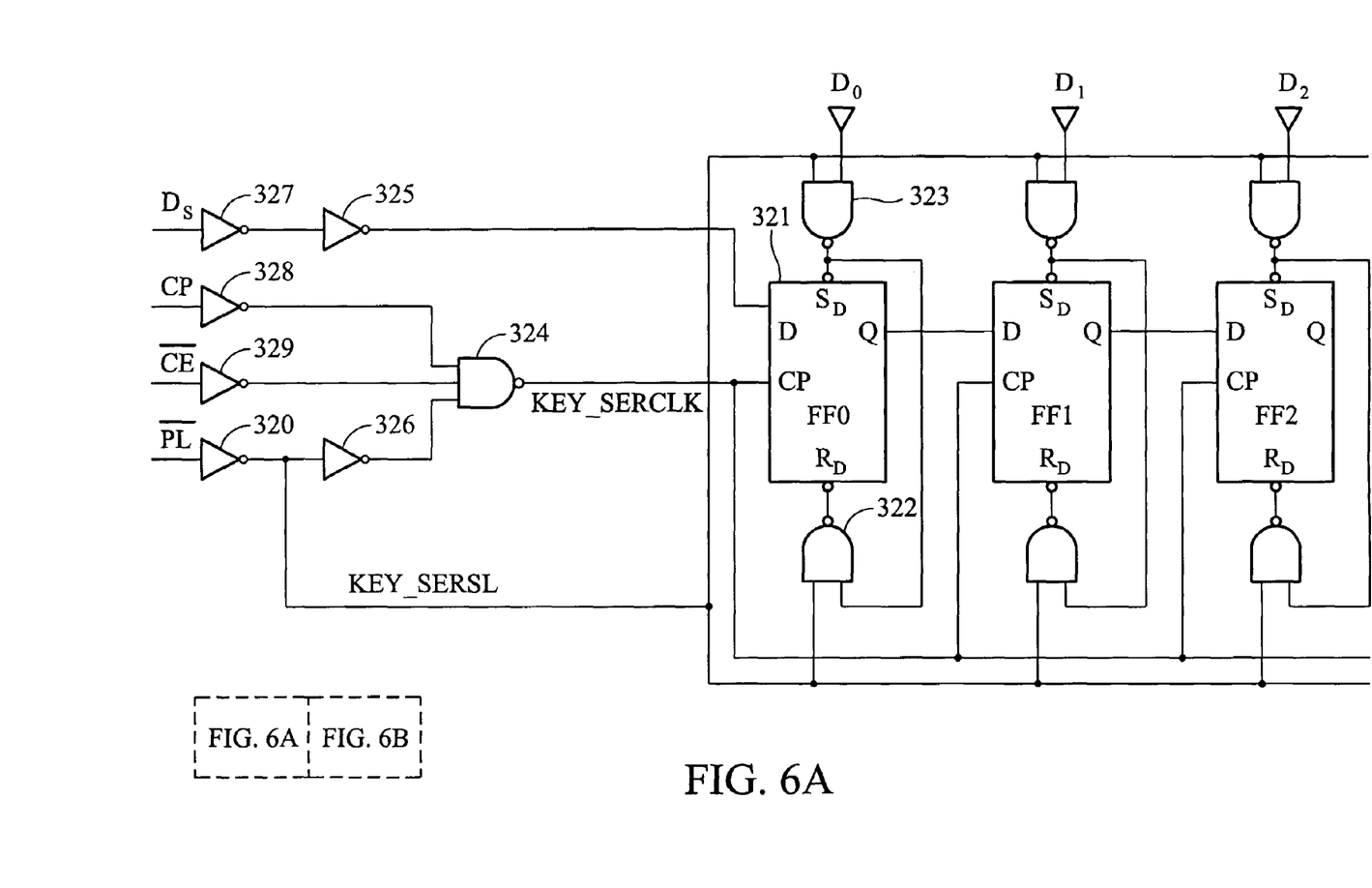
FIGS. 6A and 6B are diagrams showing a shift register circuit of the apparatus for data input according to the second embodiment of the invention.
Figure 6B:
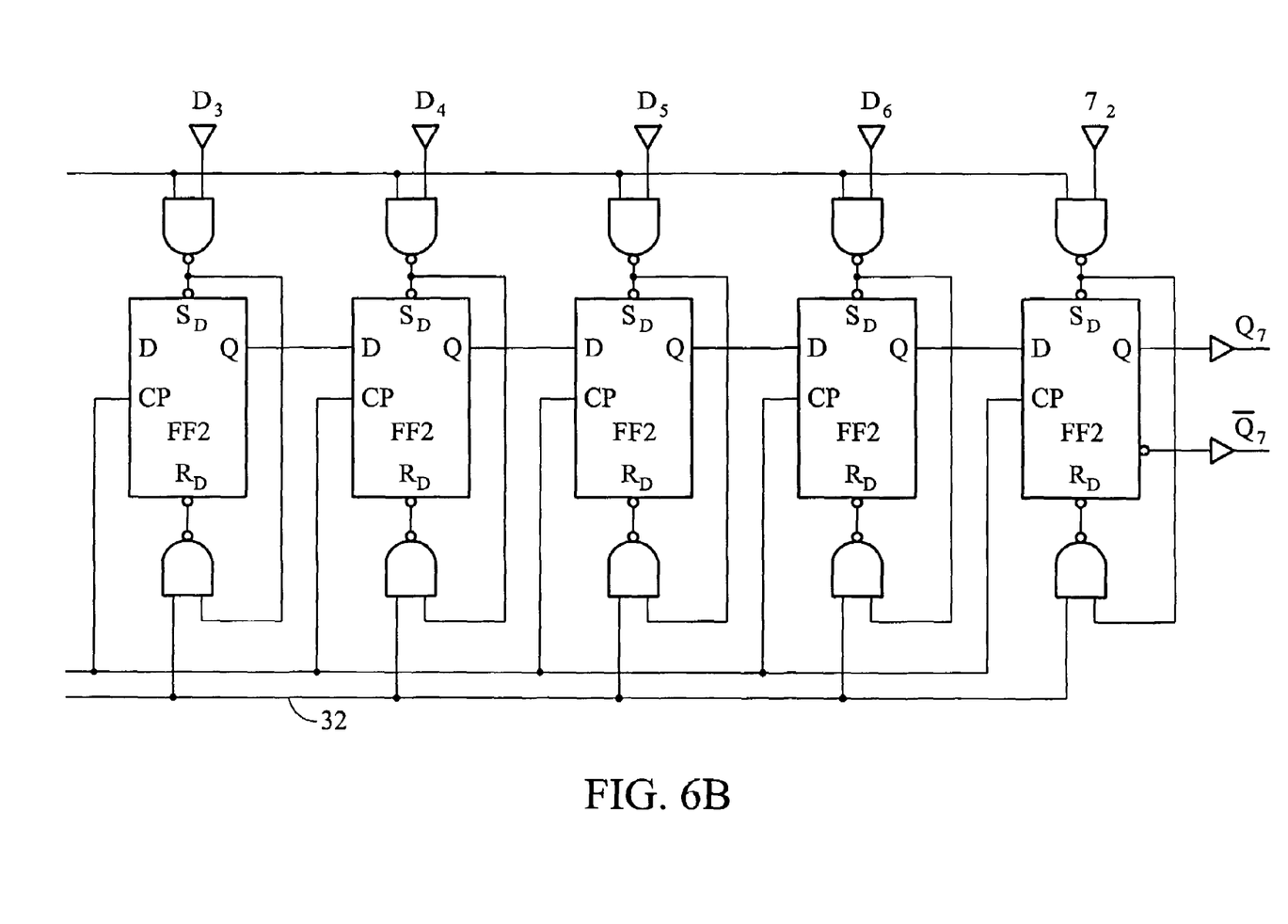

FIGS. 6A and 6B are diagrams showing a shift register circuit of the apparatus for data input according to the second embodiment of the invention. The shift register circuit acts as an 8-bit parallel-to-serial converter. Although there are only two keys illustrated in the second embodiment for example, the 8-bit shift register circuit can afford a keypad with 8 keys. It includes 8 NAND gates 322, 8 NAND gates 323, 8 flip-flops 321, inverters 320 and 325~329, and a NAND gate 324. Each of the NAND gates 322 receives the inverted strobe signal KEY_SERSL from the inverter 320 and one of the 8 data bits D0~D7 from the sensing circuit, and outputs the received data bit when the strobe signal KEY_SERSL is asserted. Each of the flip-flops 321 has input terminals SD, RD, D and CP, and an output terminal Q. The output terminal Q is coupled to the input terminal D of another adjacent flip-flop 321. When the strobe signal KEY_SERSL is asserted, each of the flip-flops 321 receives on the input terminal CP the clock signal KEY_SERCLK from the inverter 328, and on the input terminal SD one of the data bits D0-D7 which is then transferred to the output terminal Q. Each of the data bits D0~D7 is pushed forward to a next flip-flop 321 on the falling and rising edges of the clock signal KEY_SERCLK so that they are serially output to the microcontroller 31 from the terminal Q7.

In the second embodiment, although only one 8-bit shift register circuit is illustrated for example, one or more n-bit shift register circuits may be serially connected after the shift register circuit 32 for a keypad with more than 8 keys. The number of the shift register circuits or bits thereof depends on the number of keys.

Figure 7:
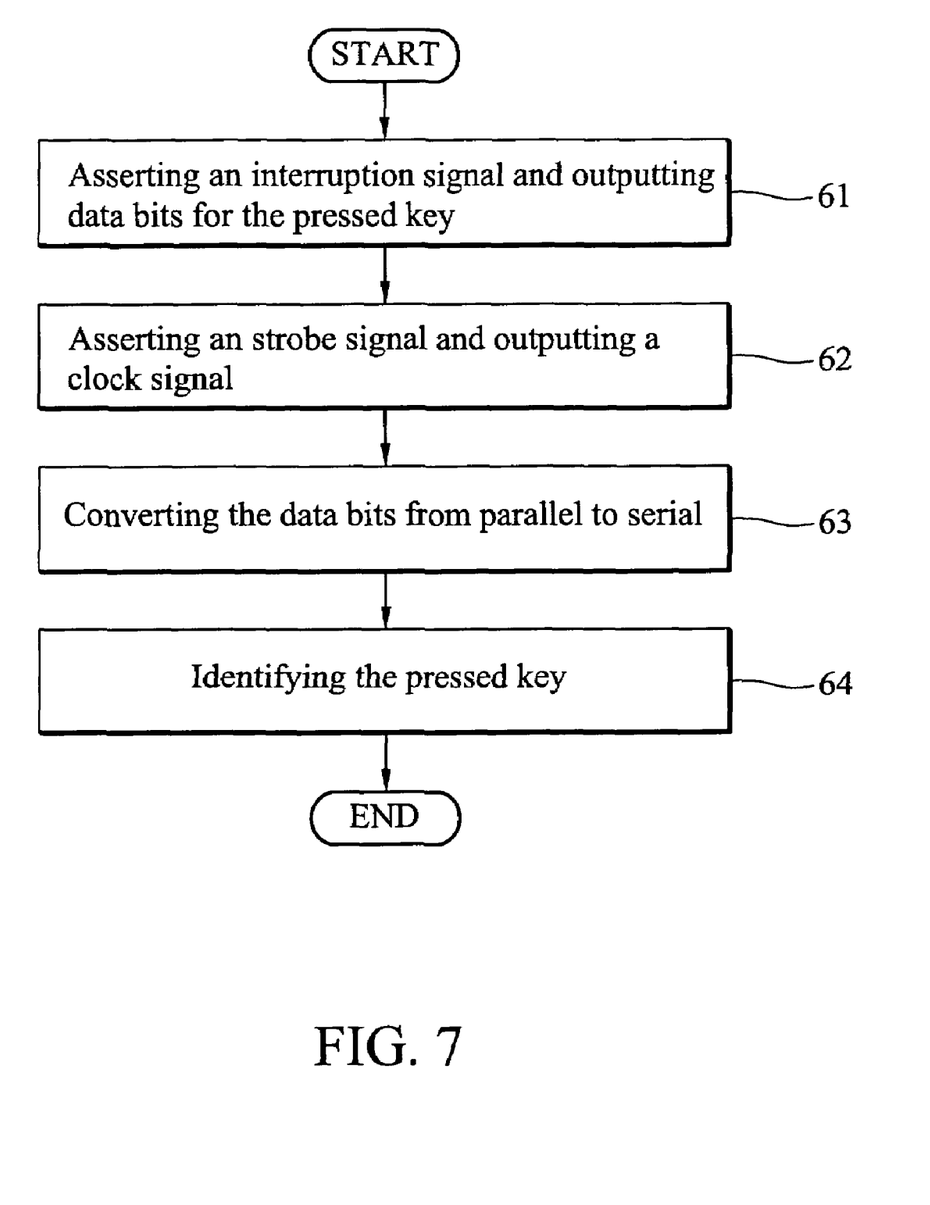
FIG. 7 is a flowchart of a method for key detection used in the apparatus for data input according to the second embodiment of the invention.

FIG. 7 is a flowchart of a method for key detection used in the apparatus for data input according to the second embodiment of the invention.

In step 61, when one of the keys 331 and 332 is pressed, the sensing circuit outputs an interruption signal KEY_PRESS# and a group of data bits corresponding to the pressed key.

In step 62, the microcontroller 31 outputs a clock signal KEY_SERCLK and a strobe signal KEY_SERSL when the interruption signal KEY-PRESS# is asserted.

In step 63, the group of data bits from the sensing circuit are received in parallel when the strobe signal KEY_SERSL is asserted and serially output to the microcontroller 31 by the shift register circuit 32 in synchronization with the clock signal KEY_SERCLK.

In step 64, the microcontroller 31 identifies the pressed key according to the received data bits.

In conclusion, the present invention provides an apparatus for data input and a key detection method thereof. In one embodiment, a sinusoidal wave signal with a frequency corresponding to the pressed key is generated by the oscillator and transformed to a square wave signal by which the processor identifies the pressed key. In another embodiment, a specific sensing circuit outputs an interruption signal and a group of data bits for the microcontroller to be interrupted and identify the pressed key. These reduce the required number of GPIO pins, resource, and power consumption, and complexity of the operation of the controller or processor.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An apparatus for data input comprising:
   a sensing circuit for a plurality of keys, outputting an interruption signal and a corresponding group of data bits when one of the keys is pressed;
   a shift register circuit receiving a strobe signal, a clock signal and the group of data bits in parallel from the sensing circuit when the strobe signal is asserted, and serially outputting the group of data bits in synchronization with the clock signal; and
   a microcontroller receiving the interruption signal, outputting the strobe signal and clock signal when the interruption signal is asserted, and serially receiving the group of data bits from the shift register circuit to identify the key being pressed.

2. The apparatus as claimed in claim 1, wherein the keys are implemented with a plurality of switches, the sensing circuit further comprises a plurality of first impedances and a second impedance, each of the switches has a first and second end respectively coupled to a first end of one of the first impedances and to receive a second voltage level, the second impedance has a first and second end respectively coupled to receive a first voltage level and second ends of the first impedances.

3. The apparatus as claimed in claim 2, wherein the first and second voltage level are respectively a power supply and ground voltage.

4. The apparatus as claimed in claim 1, wherein the shift register circuit further comprises:
   a plurality of logic gates, each having input terminals coupled to receive the strobe signal and one of the data bits from the sensing circuit, and outputting the received data bit when the strobe signal is asserted; and
   a plurality of flip-flops, each having a first input terminal receiving the data bit from one of the logic gates, a second input terminal and a third input terminal receiving the clock signal, and an output terminal coupled to the second input terminal of an adjacent flip-flop and outputting the data bit received by the first input terminal.

5. The apparatus as claimed in claim 1, wherein the interruption signal is asserted by a low logic voltage level.

6. The apparatus as claimed in claim 1, wherein the strobe signal is asserted by a low logic voltage level.

7. The apparatus as claimed in claim 1, wherein the group of data bits comprises eight data bits.

8. An apparatus for data input comprising:
   a sensing circuit for a plurality of keys, outputting an interruption signal and a corresponding group of data bits when one of the keys is pressed;
   a control circuit coupled to the sensing circuit outputting a strobe signal and clock signal when the interruption signal is asserted;
   a shift register circuit coupled to the sensing circuit and control circuit, receiving the strobe signal, the clock signal and the group of data bits in parallel from the sensing circuit when the strobe signal is asserted, and serially outputting the group of data bits in synchronization with the clock signal; and
   an identifying circuit coupled to the shift register circuit and serially receiving the group of data bits from the shift register circuit to identify the key being pressed.

9. The apparatus as claimed in claim 8, wherein the control and identifying circuit are disposed in a microcontroller.

10. The apparatus as claimed in claim 8, wherein the interruption signal is asserted by a low logic voltage level.

11. The apparatus as claimed in claim 8, wherein the strobe signal is asserted by a low logic voltage level.

12. The apparatus as claimed in claim 8, wherein the group of data bits comprises eight data bits.

* * * * *